United States Patent
Singh et al.

(10) Patent No.: US 7,409,306 B2
(45) Date of Patent: Aug. 5, 2008

(54) SYSTEM AND METHOD FOR ESTIMATING RELIABILITY OF COMPONENTS FOR TESTING AND QUALITY OPTIMIZATION

(75) Inventors: Adit D. Singh, Auburn, AL (US); Thomas S. Barnett, South Burlington, VT (US)

(73) Assignee: Auburn University, Auburn, AL (US)

( * ) Notice: Subject to any disclaimer, the term of this patent is extended or adjusted under 35 U.S.C. 154(b) by 0 days.

(21) Appl. No.: 11/715,172

(22) Filed: Mar. 6, 2007

(65) Prior Publication Data

US 2007/0162242 A1    Jul. 12, 2007

Related U.S. Application Data

(62) Division of application No. 10/274,439, filed on Oct. 18, 2002, now Pat. No. 7,194,366.

(60) Provisional application No. 60/347,974, filed on Oct. 19, 2001, provisional application No. 60/335,108, filed on Oct. 23, 2001, provisional application No. 60/366,109, filed on Mar. 20, 2002.

(51) Int. Cl.
*G06F 19/00* (2006.01)

(52) U.S. Cl. .............................. 702/81; 702/35; 702/82; 702/83; 702/84; 700/109; 700/110; 700/121

(58) Field of Classification Search ................ 702/117, 702/118, 179, 81, 181, 182, 82, 35, 33, 34, 702/83, 84; 714/755; 250/559.45; 324/158.1, 324/765; 700/109, 110, 11, 121; 257/E21.525; 706/904, 906, 912, 914, 921
See application file for complete search history.

(56) References Cited

U.S. PATENT DOCUMENTS

| | | | | |
|---|---|---|---|---|
| 3,751,647 | A | * 8/1973 | Maeder et al. | ............... 713/401 |
| 4,335,459 | A | 6/1982 | Miller | ......................... 371/38 |
| 5,250,895 | A | 10/1993 | Harigai | .................... 324/158 R |
| 5,377,148 | A | 12/1994 | Rajsuman | .................... 365/201 |
| 5,539,652 | A | 7/1996 | Tegethoff | .................... 364/490 |
| 5,822,218 | A | 10/1998 | Moosa et al. | ............... 364/488 |
| 5,917,332 | A | * 6/1999 | Chen et al. | .................... 324/765 |

(Continued)

FOREIGN PATENT DOCUMENTS

DE        100 36 118 A1     2/2002

(Continued)

OTHER PUBLICATIONS

V. Riviere et al., "Evidence of a Correlation Between Process Yields and Reliability Data for a Rad-Hard Soil Technology", IEEE 1995 Int. Conference on Microelectronic Test Structures, vol. 8, Mar. 1995, pp. 221-224.

(Continued)

*Primary Examiner*—Carol S Tsai
(74) *Attorney, Agent, or Firm*—Haverstock & Owens LLP

(57) ABSTRACT

A system and method for determining the early life reliability of an electronic component, including classifying the electronic component based on an initial determination of a number of fatal defects, and estimating a probability of latent defects present in the electronic component based on that classification with the aim of optimizing test costs and product quality.

18 Claims, 8 Drawing Sheets

U.S. PATENT DOCUMENTS

| | | | |
|---|---|---|---|
| 5,946,213 | A | 8/1999 | Steffan et al. ............ 364/468.17 |
| 5,991,699 | A | 11/1999 | Kulkarni et al. ............... 702/83 |
| 6,047,083 | A | 4/2000 | Mizuno ..................... 382/141 |
| 6,072,574 | A * | 6/2000 | Zeimantz ................. 356/237.4 |
| 6,132,108 | A | 10/2000 | Kashiwamura et al. 395/500.23 |
| 6,223,097 | B1 | 4/2001 | Hashimoto et al. .......... 700/223 |
| 6,242,270 | B1 | 6/2001 | Nagaswami et al. ......... 438/14 |
| 6,324,481 | B1 | 11/2001 | Atchison et al. ............. 702/84 |
| 6,341,241 | B1 * | 1/2002 | Mugibayashi et al. ....... 700/110 |
| 6,393,602 | B1 | 5/2002 | Atchison et al. ............... 716/4 |
| 6,423,558 | B1 | 7/2002 | Maeda et al. ................ 438/17 |
| 6,456,951 | B1 * | 9/2002 | Maeda et al. ................ 702/81 |
| 6,473,665 | B2 * | 10/2002 | Mugibayashi et al. ....... 700/110 |
| 6,496,788 | B1 * | 12/2002 | Kikuchi ...................... 702/181 |
| 6,496,958 | B1 * | 12/2002 | Ott et al. ........................ 716/4 |
| 6,539,106 | B1 | 3/2003 | Gallarda et al. ............. 382/149 |
| 6,714,885 | B1 * | 3/2004 | Lee .............................. 702/84 |
| 6,741,940 | B2 | 5/2004 | Mugibayashi et al. ......... 702/35 |
| 6,789,032 | B2 | 9/2004 | Barbour et al. ............... 702/81 |
| 6,813,572 | B2 * | 11/2004 | Satya et al. ................... 702/82 |
| 7,139,944 | B2 | 11/2006 | Barbour et al. ............. 714/718 |
| 7,194,366 | B2 | 3/2007 | Singh et al. |
| 2001/0042705 | A1 | 11/2001 | Nakagaki et al. ........... 209/44.4 |
| 2002/0053065 | A1 | 5/2002 | Mitsutake et al. ............... 716/4 |
| 2002/0142522 | A1 | 10/2002 | Pnueli et al. ................. 438/140 |
| 2002/0156550 | A1 * | 10/2002 | Langford .................... 700/110 |
| 2003/0003606 | A1 | 1/2003 | Farnworth et al. ............ 438/11 |
| 2003/0178692 | A1 | 9/2003 | Farnworth et al. .......... 257/499 |

FOREIGN PATENT DOCUMENTS

| | | |
|---|---|---|
| EP | 0660 385 A2 | 6/1995 |
| WO | WO 00/05759 A1 | 2/2000 |

OTHER PUBLICATIONS

Thomas S. Barnett et al., "Burn-In Failures and Local Region Yield: An Integrated Yield-Reliability Model", Dept. of Electrical and Computer Engineering, Auburn University, Auburn, AL 36849, Mar. 2002.

Thomas S. Barnett et al., "Yield-Reliability Modeling for Fault Tolerant Integrated Circuits", IEEE International Symposium on Defect and Fault Tolerance in VLSI Systems, 2001.

Hance H. Huston et al., "Reliability Defect Detection and Screening During Processing—Theory and Implementation", IEEE/RPS, 1992, pp. 268-275.

Fred Kuper et al., "Relation Between Yield and Reliability of Integrated Circuits: Experimental Results and Application to Continuous Early Failure Rate Reduction Programs", IEEE, 1996, pp. 17-21.

David R. Lakin II et al., "Exploiting Defect Clustering to Screen Bare Die for Infant Mortality Failures: An Experimental Study", IEEE, 1999, pp. 23-30.

E.J. McCluskey et al., "IC Quality and Test Transparency", IEEE Transactions on Industrial Electronics, vol. 36, No. 2, May 1989, pp. 197-202.

Phil Nigh et al., "An Experimental Study Comparing the Relative Effectiveness of Functional, Scan, IDDq and Delay-fault Testing", IEEE, 1997, pp. 459-464.

Jacob A. van der Pol et al., "Impact of Screening of Latent Defects at Electrical Test on the Yield-Reliability Relation and Application to Burn-in Elimination", IEEE, 1998, pp. 370-377.

Walter Carl Riordan et al., "Microprocessor Reliability Performance as a Function of Die Location for a 0.25µ, Five Layer Metal CMOS Logic Process", IEEE, 1999, pp. 1-11.

A.D. Singh et al., "Chip Test Optimzation Using Defect Clustering Information", IEEE, 1992, pp. 366-373.

A.D. Singh et al., "On Optimizing VLSI Testing for Product Quality Using Die-Yield Prediction", IEEE Transactions on Computer-Aided Design of Integrated Circuits and Systems, vol. 12, No. 5, May 1993, pp. 695-709.

A.D. Singh et al., "On Optimizing Wafer-Probe Testing for Product Quality Using Die-Yield Prediction", IEEE, 1999, Paper 8.3, pp. 228-237.

Adit D. Singh et al., "Screening for Known Good Die (KGD) Based on Defect Clustering: An Experimental Study", IEEE, 1997, Paper 15.2, pp. 362-369.

C. H. Stapper, "Correlation Analysis of Particle Clusters On Integrated Circuit Wafers", IBM J. Res. Develop., vol. 31, No. 6, Nov. 1987, pp. 641-650.

C. H. Stapper, "Yield Model for Productivity Optimization of VLSI Memory Chips with Redundancy and Partially Good Product", IBM J. Res. Develop., vol. 24, No. 3, May 1980, pp. 398-409.

T. W. Williams et al., "Defect Level as a Function of Fault Coverage", IEEE Transactions on Computers, vol. C-30, No. 12, Dec. 1981, pp. 987-988.

Thomas S. Barnett et al., "Process to Estimate the Reliability of Redundant Circuits with Respect to Early-Life Failures and Optimize Stress Testing", pp. 1-3, Oct. 2001.

Thomas S. Barnett et al., "Estimating Burn-In Fall-Out for Redundant Memory", pp. 1-8, Mar. 2002.

T. Barnett et al., "Redundancy Implications for Product Reliability", May 18, 2001, V4.3.

Charles H. Stapper et al., "Integrated Circuit Yield Statistics", Proceedings of the IEEE, vol. 71, No. 4, Apr. 1983, pp. 453-470.

Sharad C. Seth et al., "Characterizing the LSI Yield Equation from Wafer Test Data", IEEE Transactions on Computer-Aided Design, vol. CAD-3, No. 2, Apr. 1984, pp. 123-126.

* cited by examiner

| $Y_K$ | $\alpha = 0.5$ | $\alpha = 1$ | $\alpha = 2$ | $\alpha = 4$ | $\alpha = \infty$ |
|---|---|---|---|---|---|
| 30 | .452 | .695 | .898 | 1.03 | 1.20 |
| 50 | .373 | .498 | .583 | .634 | .691 |
| 70 | .254 | .299 | .326 | .338 | .356 |
| 90 | .095 | .100 | .103 | .104 | .105 |

| $Y_K$ | $\alpha = 0.5$ | $\alpha = 1$ | $\alpha = 2$ | $\alpha = 4$ | $\alpha = \infty$ |
|---|---|---|---|---|---|
| 0.20 | 4.93 | 2.96 | 1.98 | 1.49 | 1.00 |
| 0.30 | 4.93 | 2.97 | 1.99 | 1.49 | 1.00 |
| 0.40 | 4.94 | 2.97 | 1.99 | 1.50 | 1.00 |
| 0.50 | 4.94 | 2.98 | 1.99 | 1.50 | 1.00 |
| 0.60 | 4.95 | 2.98 | 1.99 | 1.50 | 1.00 |
| Approx. | 5.00 | 3.00 | 2.00 | 1.50 | 1.00 |

|  | $\alpha = 0.5$ | $\alpha = 1$ | $\alpha = 2$ | $\alpha = 4$ | $\alpha = \infty$ |
|---|---|---|---|---|---|
| Die with 0 Repairs | 0.624 | 0.892 | 1.02 | 1.09 | 1.37 |
| 0 Repairs and 0 Faulty Neighbors | 0.082 | 0.155 | 0.279 | 0.465 | 1.37 |
| Ratio | 7.61 | 5.75 | 3.74 | 2.34 | 1.00 |

FIG. 14

|  | $\alpha = 0.5$ | $\alpha = 1$ | $\alpha = 2$ | $\alpha = 4$ | $\alpha = \infty$ |
|---|---|---|---|---|---|
| Repaired Die | 4.30 | 2.79 | 2.06 | 1.71 | 1.37 |
| 0 Repairs and 0 Faulty Neighbors | 0.082 | 0.155 | 0.279 | 0.465 | 1.37 |
| Ratio | 52.4 | 18.0 | 7.38 | 3.68 | 1.00 |

FIG. 15

SYSTEM AND METHOD FOR ESTIMATING RELIABILITY OF COMPONENTS FOR TESTING AND QUALITY OPTIMIZATION

CROSS-REFERENCE TO RELATED APPLICATIONS

This Patent Application is a divisional of U.S. patent application Ser. No. 10/274,439, filed on Oct. 18, 2002, now U.S. Pat. No. 7,194,366 which claims the benefit of U.S. Provisional Patent Application Ser. No. 60/347,974, filed Oct. 19, 2001; U.S. Provisional Patent Application Ser. No. 60/335,108, filed Oct. 23, 2001; and U.S. Provisional Patent Application Ser. No. 60/366,109, filed Mar. 20, 2002; all of which are hereby incorporated by reference in their entireties for all purposes.

The U.S. Government has a paid-up license in this invention and the right in limited circumstances to require the patent owner to license others on reasonable terms as provided for by the terms of Contract/Grant No. NSF-CCRL-9912389 awarded by the National Science Foundation (NSF).

FIELD OF THE INVENTION

The present invention relates generally to the field of reliability testing and engineering; and more particularly to a yield-reliability model based system and method for classifying electronic components and other devices including integrated circuits and memory chips based on predicted early life reliability to allow optimization of test costs and product quality.

BACKGROUND OF THE INVENTION

Electronic components such as integrated circuits, including memory chips, often fail due to flaws resulting from the manufacturing process. Indeed, even as manufacturing processes are improved to reduce defect rates, increasingly complex chip designs require finer and finer circuitry, pushing the limits of the improved manufacturing processes and increasing the potential for defects. Electronic components are commonly subjected to an initial wafer probe test after production of the wafer from which the components are separated, in order to detect catastrophic or "killer" defects in their circuitry. Wafer probe testing, however, typically will not detect less severe or "latent" defects in the circuitry that may nevertheless result in early-life failure or "infant mortality" of a component.

Although the percentage of electronic components such as memory chips and integrated circuits that are manufactured with latent defects may be relatively small (for example on the order of 1-4%), many modern electronic devices incorporate up to fifty or more such components. Early-life failure of any one of these components may destroy or significantly degrade the performance of the overall device. As a result, even a small percentage of latent defects in the components can produce an undesirably high rate of failure in the assembled device.

In order to reduce the incidence of infant mortality and thereby increase reliability, many manufacturers subject their components to accelerated life-cycle testing, referred to as stress testing or "burn-in". During burn-in, some or all of the components produced are stress-tested by subjecting them to elevated temperature, voltage, and/or other non-optimal condition(s) in order to precipitate component failure resulting from latent defects that were not identified by the initial wafer probe testing. Due to their very fine circuitry, however, many modern electronic components cannot withstand severe burn-in conditions without incurring damage, even to components that initially had no latent defects. As a result, stress tests must now typically be performed more gently, for example using lower temperature and/or voltage conditions, thereby requiring longer duration burn-in periods to identify latent defects. In addition, the stress testing conditions often must be very carefully and precisely controlled. For example, because different chips within even a single production run may generate differing amounts of heat during operation, burn-in of some types of chips requires the provision of separate and individually temperature-controlled burn-in chambers for each chip being tested. Due to the increased complexity and duration, the stress test or burn-in process represents a significant portion of the expense of many modern electronic components.

In order to reduce the time and expense of component burn-in, a "binning" system and method have been developed. In many instances, both killer and latent defects result from like or related causes. For example, a dust particle may interrupt a conductive path entirely, resulting in a killer defect; or it may interrupt a conductive path only partially, resulting in a latent defect that passes the initial wafer probe test but produces an early life failure. Because many causes of killer and latent defects are localized, both types of defects are often found to cluster in regions on a wafer. As a result, it has been discovered that a component is more likely to have a defect if its neighboring components on the wafer also have defects. For example, a component that passes wafer-probe testing is more likely to have a latent defect if one or more of its neighboring components on the wafer are found to have killer defects than if all of its neighboring components on the wafer also pass wafer-probe testing. And it has been discovered that the likelihood of a component that passes wafer-probe testing having a latent defect increases with the number of neighboring components that fail wafer-probe testing. By "binning" those components that pass wafer-probe testing into separate groups depending on how many of its neighbors failed wafer-probe testing, the components are separated into groups expected to have greater or lesser degrees of early life reliability. For example, as seen with reference to FIG. 1, a wafer 10 contains a plurality of components or die. Some of the die on wafer 10 contain killer defects, indicated with an "X", which will fail the wafer-probe test. The remaining die do not contain killer defects, but may contain latent defects. Die without killer defects may be categorized depending on the number of neighboring die that have killer defects. For example, die A has five immediately adjacent neighbors found to have killer defects, die B has one immediately adjacent neighbor found to have a killer defect, and die C has no immediately adjacent neighbors found to have killer defects. Die categorized in this manner may then be binned according to the number of immediately adjacent neighbors found to have killer defects. For example, if the eight immediately adjacent neighboring die on the wafer 10 are considered, each die will have between zero and eight neighbors with killer defects. As shown in FIG. 2, die such as C, with no neighbors having killer defects, will be placed in bin 0; die such as B, with one neighbor having a killer defect, will be placed in bin 1; die with two neighbors with killer defects will be placed in bin 3; and so on.

Since defects (killer and latent) tend to cluster in regions on the wafer, die in bin 0 will be statistically the least likely to have latent defects, whereas die in bin 8 will be statistically the most likely to have latent defects. Die in the successive intermediate bins 2-7 will have progressively greater statistical likelihood of having latent defects. By burn-in testing a representative sample of dies from each of the bins 1-8 ("sample burn-in"), the statistical likelihood of latent defects for all die within each respective bin can be estimated. The remaining die in those bins having a statistically-estimated likelihood of latent defect that is lower than the specified failure-in-time ("FIT") rate (the maximum rate of burn-in failure deemed acceptable) need not be individually burned in, since on average they will meet or exceed the desired reliability. The remaining die in those bins having a statistically-estimated likelihood of latent defect that is higher than the specified FIT rate may be subjected to individual burn-in testing. Although binning and sample burn-in can reduce the cost of burn-in testing by eliminating the need to individually test some of the die (namely those die remaining in bins having a statistically-estimated likelihood of latent defect that is lower than the specified FIT rate after sampling), burn-in costs can still be significant since a statistically significant sample of die from each bin must be tested. These costs can add considerably to the cost of component manufacture. Thus, it can be seen that needs exist for improved systems and methods for determining the reliability of electronic components and other devices including integrated circuits and memory chips. It is to the provision of improved systems and methods for determining the reliability of electronic components and other devices meeting these and other needs that the present invention is primarily directed.

SUMMARY OF THE INVENTION

The present invention provides improved systems and methods for determining the reliability of electronic components and other devices including integrated circuits and memory chips. Although example embodiments will be described herein primarily with reference to integrated circuits and memory chips, it will be understood that the systems and methods of the present invention are also applicable to reliability testing of any component that exhibits manufacturing defect clustering. For example, nanotechnology devices such as molecular computing components, nanodevices and the like, may exhibit defect clustering in or on the base materials from which they are produced.

Example embodiments of the invention provide improved efficiency of reliability testing of components based on a binning and statistical modeling system. Components are binned or otherwise classified based on the number of neighboring components found to have defects by wafer probe or other form of initial testing. The number of neighboring components included in the classification scheme is not critical. As few as one neighboring component may be considered, but preferably all of the immediately neighboring components (typically numbering about 8) are considered. Neighboring components beyond the subject component's immediate neighbors optionally also can be considered, but in many instances their consideration will not add significantly to the accuracy of the model. The classification or segregation of components based on the number of defects includes classification or segregation based on the presence or absence of defects (i.e., zero defects or greater than zero defects), as well as classification or segregation based on the actual count of defects (i.e., one defect, two defects, three defects, etc.).

The reliability models employ statistical methods to capture the effect of defect distribution on the wafer (i.e., statistically modeling a measure of the extent of defect clustering). While negative binomial statistics are most widely used in practice and are suitable for use in the example models disclosed herein, any statistical method that can reasonably model the clustering of defects on wafers may be employed. For example, the center-satellite model can also be used. Because the invented methods relate wafer probe yield to early life reliability, most of the parameters needed by the reliability models can be readily obtained from data available following wafer probe testing. Only an estimate for the ratio of killer to latent defects, or equivalent information, is needed for complete early life reliability prediction for each bin. By sample testing components from fewer than all of the bins or classifications, the ratio of killer defects to latent defects is determined. For example, a sample of components from only one bin or classification need be tested. Preferably, a sample of components from the bin or classification having the maximum number of neighbors with killer defects will be tested (i.e., the "worst" bin or classification having the lowest expected reliability), as this classification will typically contain the greatest percentage of latent defects (due to defect clustering), and will provide a statistically useful measure of the degree of defect clustering with the smallest sample size. Based on this sample testing, the reliability of components in all of the bins can be estimated based on statistical modeling.

These reliability estimates can then be used to optimize subsequent testing, e.g. burn-in, in a number of different ways. For example, those bins determined to have a reliability rate equal to or higher than a desired or specified reliability rate need not be individually stress tested, or tested using a lower cost test such as a elevated voltage stress test instead of full burn-in. Further, if burn-in screening can ensure failure rates in the stress tested bins to be well below the specified reliability rates, then one or more bins with reliability rates somewhat below the specification can also avoid expensive burn-in as long as all the bins taken as a whole meet the overall reliability specification. Burn-in duration for the different bins can also be varied to achieve the desired reliability at minimum cost For example, components from bins with higher estimated reliability may be stress tested for a shorter duration than components from bins with lower estimated reliability. Thus, the present invention obviates the need for burn-in testing of a sample of components from each bin to determine the burn-in fallout from each bin.

In other embodiments of the invention, the reliability of a chip comprising redundant circuits that can be used to repair faulty circuitry (including, without limitation, memory chips and non-memory chips such as processor chips incorporating embedded memory) is statistically estimated, and the circuits classified for subsequent test and quality optimization, based on the number of repairs made to the subject chip itself. The need for repair, such as switching in one or more redundant rows and/or columns of memory cells in redundant memory chips, typically results from an initial test indicating the presence of a defect on the chip. Because latent defects are found to cluster with defects observed by initial testing, a chip requiring memory repairs is more likely to also have latent defects that were not observed by initial testing than a chip that did not require memory repairs. Likewise, the greater the number of memory repairs required on a chip (thereby indicating a greater number of defects observed by initial testing), the greater the likelihood of that chip also having latent defects. In other words, the more memory repairs a chip required, the less reliable that chip is.

By sample testing to determine the ratio of latent to killer defects, the reliability of chips comprising redundant memory circuits is statistically modeled based on the incidence of repairs. By binning or otherwise classifying components based on the number of repairs required, such as for example the number of redundant memory cells or arrays switched in, the reliability of components in each classification is statistically determined. The classification or segregation of components based on the number of repairs required includes classification or segregation based on the presence or absence of repairable defects (i.e., zero or greater than zero repairs required), as well as classification or segregation based on the actual count of repairable defects. Preferably, the statistical determination of reliability is carried out by testing a sample of components from fewer than all bins or classifications, most preferably from the bin or classification of components requiring the greatest number of memory repairs (as this classification will provide a statistically useful sample with the smallest sample size).

Stress testing of individual bins or classifications can then be optimized in various ways. For example, bins determined to have a reliability rate equal to or higher than a desired or specified reliability rate need not be individually tested. Optionally, the number of repairs conducted on neighboring components on a semiconductor wafer also are factored into the reliability model. In further embodiments of the present invention, reliability modeling is based on both the number of neighboring die found to have killer defects and the number of redundant memory repairs performed on the subject die itself.

Example embodiments of the present invention advantageously enable optimization of the duration of burn-in testing of components. For example, a shorter burn-in time can be used when testing a sample of components from the bin or classification that is statistically the most likely to have latent defects (i.e., the bin of components having the most neighbors with killer defects or the bin of components that required the greatest number of redundant memory repairs) than would be needed for testing components from the other bins or classifications, as a statistically significant number of failures due to latent defects will generally take less time to precipitate from such a sample.

The system and method of the present invention are also well suited to reliability screening of die for use in multi-chip modules (MCMs) or other composite electronic devices assembled from components that cannot be stress tested. Because burn-in testing of bare die for MCMs is difficult and expensive, MCMs are typically burned in after assembly of the dies into an MCM. A single failing die generally results in scrapping of the entire high-cost MCM. Using only die from the bin or classification that is statistically the least likely to have latent defects (i.e., the bin of components having the least neighbors with killer defects or the bin of components that required the fewest number of redundant memory repairs) can significantly reduce scrap loss.

In one aspect, the invention is a method of determining the reliability of a component. The method preferably includes classifying the component based on an initial determination of a number of fatal defects. The method preferably further includes estimating a probability of latent defects present in the component based on that classification, by integrating yield information based on the initial determination of a number of fatal defects with sample stress-testing data using a statistical defect-clustering model.

In another aspect, the invention is a method of determining the reliability of a repairable component. The method preferably includes performing an initial test on the component to identify repairable defects in the component. The method preferably further includes classifying the component based on the number of repairable defects identified by the initial test.

In yet another aspect, the invention is a method of determining the reliability of a component. The method preferably includes classifying the component based on an initial determination of a number of neighboring components having fatal defects. The method preferably also includes testing a sample of components from fewer than all of a plurality of classifications to estimate a probability of latent defects present in the component.

In yet another aspect, the invention is a method for predicting the reliability of a component. The method preferably includes classifying a component into one of a plurality of classifications based on an initial test. The method preferably also includes optimizing further testing of the component based on the classification thereof.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawings and detailed description of the invention are exemplary and explanatory of preferred embodiments of the invention, and are not restrictive of the invention, as claimed.

BRIEF DESCRIPTION OF THE DRAWING FIGURES

FIG. 14 shows the burn-in failure probability for die with zero repairs compared to die with zero repairs and zero faulty neighbors, determined according to an example embodiment of the present invention.

FIG. 15 shows the burn-in failure probability for die with at least one repair compared to die with zero repairs and zero faulty neighbors, determined according to an example embodiment of the present invention.

DETAILED DESCRIPTION

Figures 1, 2:
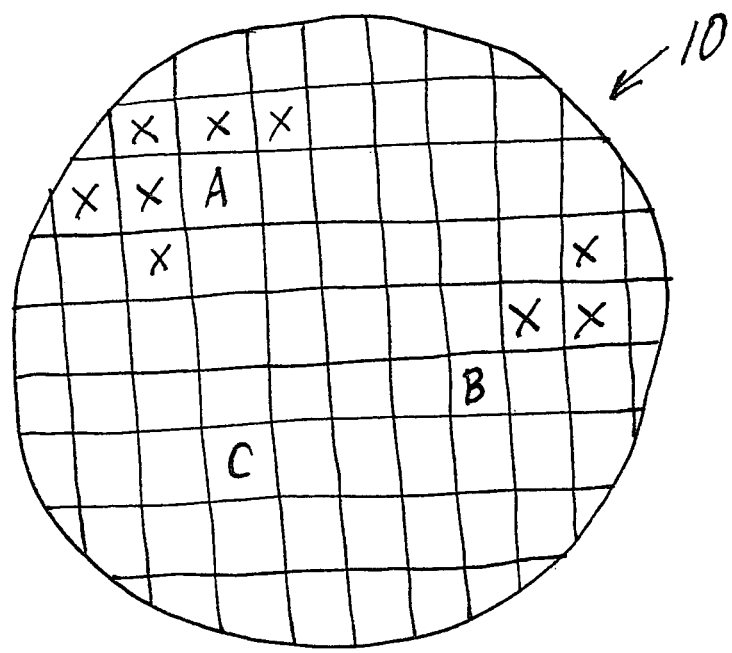
FIG. 1 shows a wafer comprising a plurality of die for reliability testing according to an example embodiment of the present invention.
FIG. 2 shows bins of die grouped according to an example embodiment of the present invention.

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

In example embodiments, one aspect of the present invention utilizes an integrated yield-reliability model to estimate burn-in failure and local region yield. Another aspect of the present invention uses an integrated yield-reliability model to estimate the rate of burn-in failure for repairable memory chips. These models can be utilized separately or in tandem, and are described in greater detail below, with reference to the drawing figures.

Burn-in testing is used widely in the semiconductor industry to ensure the quality and reliability of integrated circuits. The objective is to precipitate early life failures through stress testing before the parts are shipped, and thereby maximize reliability in the field. Unfortunately, burning-in bare die is difficult and expensive. To further complicate matters, the burning in of die can actually reduce die reliability in some cases, as by damaging defect-free delicate circuitry by overstressing during burn-in. Also, the contact pins that make electrical connections to bare die during burn-in can scratch or dent the die's bonding pads. In MCM applications, some of these problems can be avoided by burning-in the complete MCM package after assembly, rather than as individual die. This can, however, significantly increase the cost of losses from scrapped parts, where failing die often cannot be replaced to repair an MCM. Thus, a typical 1-2% burn-in fall-out rate for individual ICs (and bare die) can result in an almost 10% burn-in fall-out rate for a packaged 5-die MCM. Manufacturers are, therefore, highly motivated to select only the most reliable die for use in MCM assembly.

The majority of reliability failures of electronic components are early life or infant mortality failures. These failures can generally be attributed to flaws acquired during product manufacturing, and consequently, are the same types of defects that cause failures detectable at wafer probe testing. One embodiment of the present invention uses yield models based on the number of circuit failures occurring at wafer probe to estimate reliability failures detected during stress testing or burn-in. Since defects are known to cluster, die from low yield regions of a wafer are found to be more susceptible to both catastrophic failures or "killer defects" (detectable at wafer probe testing) and burn-in failures (due to "latent defects"). Low yield regions of a wafer are known to result in test escape numbers (i.e. defect levels) up to an order of magnitude greater than high yield regions of a wafer. Analysis of burn-in results suggests a similar relationship between local region yield and early-life reliability failures. One aspect of the present invention exploits this fact to obtain high quality (i.e. low burn-in fallout) die from high yielding regions of wafers. In one application of the invention, such high quality die can be used in Multi-Chip Module (MCM) applications without the need for expensive bare die burn-in tests.

Figures 3, 4:
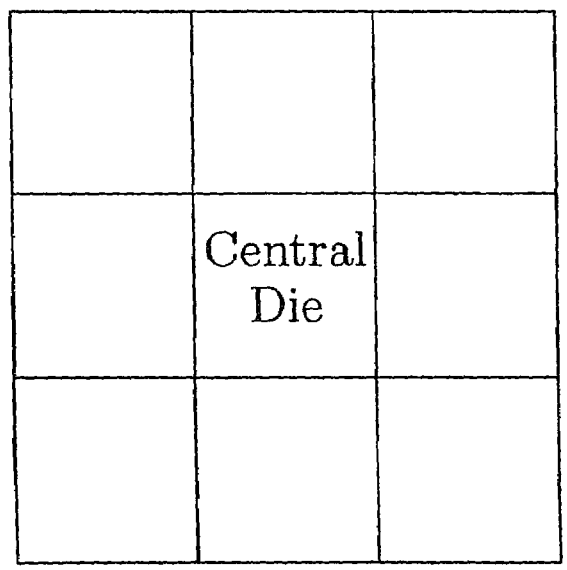
FIG. 3 shows a typical nine die neighborhood of a semiconductor wafer, suitable for reliability modeling according to an example embodiment of the present invention.
FIG. 4 shows a table of reliability failure probability for various wafer probe yields and values of clustering parameter, determined according to an example embodiment of the present invention.

The present invention uses an analytical model to predict the number of burn-in failures one can expect following wafer probe testing. The model is used to quantify the benefits of binning die based on local region yield. Local yield information is incorporated into testing and can be done easily, for example, by considering a central die and its 8 adjacent neighbors. The number of neighboring die considered, is generally not critical, and more or fewer than 8 neighboring die can be considered. Extending the neighborhood beyond the 8 adjacent die however, typically impacts the results only marginally. Thus, in one example embodiment, test results over a 9 die neighborhood are taken to define the neighborhood or local region yield. This is shown in FIG. 3. By sorting die that test good at wafer probe into 1 of 9 bins depending on how many of their neighbors test faulty, one essentially separates die according to local region yield. Die in bin 0 have 0 faulty neighbors, die in bin 1 have 1 faulty neighbor, and so on until bin 8, where all neighbors were faulty. As in the case of defect levels, one expects die in the lower bins (i.e. from high yield regions) to exhibit significantly fewer burn-in failures than those in the higher numbered bins (i.e. from low yield regions).

Yield models for integrated circuits under the present invention preferably incorporate a determination of the average number of defects per chip, generally denoted by $\lambda$. Traditionally, such models have focused on those defects that cause failures detectable at wafer probe testing, while neglecting those defects that cause early life or reliability failures. The present invention recognizes that defects are generally of three possible types: killer defects, latent defects, and defects that cause no failures at all. The latter of the three is of no consequence with regard to actual circuit failures, and may therefore be neglected. Thus, one can write $$\lambda = \lambda_K + \lambda_L \quad (1)$$

where $\lambda_K$ is the average number of killer defects and $\lambda_L$ is the average number of latent defects. Killer defects are of sufficient size and placed in such a way as to cause an immediate circuit failure. These can be detected at wafer probe testing. Latent defects, however, are either too small and/or inappropriately placed to cause an immediate failure. These defects, however, can cause early life failures in the field. Defects that cause failures detectable at wafer probe are, in general, fundamentally the same in nature as those which cause reliability failures; size and placement typically being the primary distinguishing features. Thus, it can be assumed that $\lambda_L$ is linearly related to $\lambda_K$. Such an assumption has been shown to agree well with experimental data over a wide range of yield values. Under this assumption one may write $$\lambda_L = \gamma \lambda_K \quad (2)$$

where γ is a constant.

The usefulness of equation (2) may be illustrated with a simple example. The simplest model for yield assumes that defects are distributed according to Poisson statistics. According to this model, the yield following wafer probe testing is $$Y_K = \exp(-\lambda_K) \quad (3)$$

If the number of latent defects also follows a Poisson distribution then one may write $$Y_L = \exp(-\lambda_L) \quad (4)$$

Substituting (2) into (4) and using (3) relates the yields through the constant γ. That is, $$Y_L = \exp(-\lambda_L) = \exp(-\gamma \lambda_K) = Y_K^\gamma \quad (5)$$

Notice that taking the logarithm of both sides of equation (5) gives a linear equation with slope γ. Previous research has used such an approach on yield data from microprocessors fabricated in a 0.25 μm process to obtain a numerical value of γ. Plotting this data on a log-log scale they determined γ to fall within the range 0.01-0.02. That is, for every 100 killer defects, one expects, on average, 1-2 defects to result in latent faults. While the actual value of γ is expected to be process dependent, these values provide a useful order of magnitude estimate.

Modeling $Y_K$ with the Poisson yield equation has been found to be an over simplification. Indeed, such a model generally underestimates the value of $Y_K$. This results from the fact that defects are not randomly distributed as implied by a Poisson model, but are known to cluster. Qualitatively speaking, this simply means that defects are more likely to be found in groups than by themselves. If such is the case, then the probability that an individual die contains multiple defects increases slightly. Consequently, although the total number of defects may remain the same, the defects are contained within fewer die. The end result is an increased overall yield. Accordingly, preferred forms of the present invention favor negative binomial statistics over the Poisson yield model.

Imagine that an experiment consists of placing a single defect on an integrated circuit. The outcome of this experiment is therefore either a killer or latent defect. If these defects occur with probabilities $p_K$ and $p_L$, respectively, then a series of N such experiments will follow a binomial distribution. Thus, if K(m) denotes the event of exactly m killer defects and L(n) the event of exactly n latent defects, then, given a total of N defects, the probability of m killer and n latent defects is given by $$P[K(m)L(n) | N] = \binom{N}{m} p_K^m p_L^n \quad (6)$$

where N=m+n and $p_K + p_L = 1$. Note that (6) implies that the average number of latent defects is $\lambda_L = N p_L$. Similarly, $\lambda_K = N p_K$. Thus, $$\lambda_L = \frac{p_L}{p_K} \lambda_K.$$

But from equation (2) we have that $\lambda_L = \gamma \lambda_K$. It follows that $$\gamma = \frac{p_L}{p_K}.$$

Combining this with the equation $p_K + p_L = 1$ relates the probabilities for latent and killer defects to the parameter γ. That is, $$p_L = \left(\frac{\gamma}{1+\gamma}\right) \text{ and } p_K = \left(\frac{1}{1+\gamma}\right) \quad (7)$$

Thus, for γ=0.01, $p_L \approx 0.0099$ and $p_K \approx 0.9901$.

Equation (6) specifies the probability of m killer and n latent defects given N defects. If the value of N is not known, one must specify its probability as well. To do this, and to account for the clustering of defects, one assumes that the defects are distributed according to negative binomial statistics. That is, if Π(N) is the probability that there are exactly N defects over a specified area (e.g. the area of a chip), then $$\prod(N) = \frac{\Gamma(\alpha+N)}{N!\Gamma(\alpha)} \frac{\left(\frac{\lambda}{\alpha}\right)^N}{\left(1+\frac{\lambda}{\alpha}\right)^{\alpha+N}} \quad (8)$$

where Γ(x) is the Gamma function, λ is the average number of defects (both killer and latent) over some specified area, and α is the clustering parameter. The value of α typically ranges from 0.5 to 5 for different fabrication processes; the smaller values indicate increased clustering. As α→∞ the negative binomial distribution becomes a Poisson Distribution, which is characterized by no clustering.

It is of particular interest to consider equation (8) when N=0. This gives the probability that a chip contains zero killer and zero latent defects. That is, $$Y = \prod(0) = \left(1 + \frac{\lambda}{\alpha}\right)^{-\alpha} \quad (9)$$

This is the yield following wafer probe and burn-in testing.

Although equation (9) gives the overall yield, it is advantageous to break it down further into the yield following wafer probe testing and the yield following burn-in. Toward this end, consider the probability of exactly m killer and n latent defects. This can be written as $$P[K(m)L(n)] = \binom{N}{m} p_K^m p_L^n \prod(N) \quad (10)$$

where N=m+n is the total number of defects over the given area. To obtain the probability of exactly m killer defects regardless of the number of latent defects, one can sum P[K(m)L(n)] over n. That is, $$P[K(m)] = \sum_{n=0}^{\infty} P[K(m)L(n)] \qquad (11)$$

Substituting equation (10) into (11) and using the identity $$\frac{\Gamma(\beta+n)}{n!\Gamma(\beta)} = (-1)^n \binom{-\beta}{n}$$

allows one to write the summation as a power series of the form $$A \sum_{n=0}^{\infty} \binom{-\beta}{n}(-x)^n = A(1-x)^{-\beta}.$$

The probability of exactly m killer defects can then be written as $$P[K(m)] = \frac{\Gamma(\alpha+m)}{m!\Gamma(\alpha)} \frac{\left(\frac{\lambda_K}{\alpha}\right)^m}{\left(1+\frac{\lambda_K}{\alpha}\right)^{\alpha+m}} \qquad (12)$$

where $\lambda_K = p_K \lambda$. Thus, the number of killer defects follows a negative binomial distribution with parameters $(\lambda_K, \alpha)$ This shows that the integrated yield-reliability model does not change the standard yield formula for predicting wafer probe failures. In particular, according to equation (23), the yield following wafer probe testing is given by $$Y_K = P[K(0)] = \left(1 + \frac{\lambda_K}{\alpha}\right)^{-\alpha} \qquad (13)$$

Defining the reliability yield $Y_L$ as the number of die which are functional following burn-in divided by the number of die which passed wafer probe, one can write $Y_L = P[L(0)|K(0)]$. In words, $Y_L$ is the probability of zero latent defects given that there are zero killer defects. From Bayes' Rule $P[K(0)L(0)] = P[L(0)|K(0)]P[K(0)]$ it follows that $Y = Y_K Y_L$. Hence, $$Y_L = \frac{Y}{Y_K} = \left(1 + \frac{\lambda_L(0)}{\alpha}\right)^{-\alpha} \qquad (14)$$

where $\lambda_L(0) = \lambda_L/(1+\lambda_K/\alpha)$ is the average number of latent defects given that there are zero killer defects. Using $\lambda_L = \gamma \lambda_K$ and solving equation (24) for $\lambda_K$ allows one to write $\lambda_L(0) = \gamma \alpha (1-Y_K^{1/\alpha})$. Thus, equation (14) may be rewritten as $$Y_L = [1 + \gamma(1 - Y_K^{1/\alpha})]^{-\alpha} \qquad (15)$$

Notice that $Y_K$ and $\alpha$ are obtained from the results of wafer probe testing, and thus $\gamma$ is the only unknown parameter in equation (15). $\gamma$ may be obtained either from the statistical analysis of burn-in data or from direct calculation. A direct calculation of $\gamma$ is carried out by considering the details of the circuit layout. This method relies on the calculation of a reliability critical area [?].

FIG. 4 tabulates the reliability failure probability $(1-Y_L)$ in percent for various values of $Y_K$, $\alpha$, and $\gamma=0.01$. Notice that clustering can have a significant impact on the probability of failure, particularly for the lower values of $Y_K$. For example, when $Y_K$ is 30 percent the probability of failure is $$\frac{1.20}{.452} = 2.65 \text{ times greater for } \alpha = \infty \text{ (no clustering)}$$

than for $\alpha=0.5$ (highly clustered). This ratio decreases as one increases $Y_K$, falling to 1.11 at $Y_K=90$ percent.

An important limiting case of equation (14) occurs for $\alpha \rightarrow \infty$. In this limit $Y_L \rightarrow \exp(-\lambda_L(0))$ and $\lambda_L(0) \rightarrow \lambda_L = \gamma \lambda_K$. Thus, $$Y_L = \exp(-\lambda_L) = \exp(-\gamma \lambda_K) = Y_K^\gamma \qquad (16)$$

This is identical to equation (5) described at the end of previous section.

Suppose that all the die from a particular fabrication process that test good at wafer probe are sorted into bins depending on how many of their neighbors test faulty. For the nine die neighborhood shown in FIG. 3 there will be nine such bins labeled from zero to eight. Die in the $i^{th}$ bin (i=0, 1, ..., 8) have tested good at wafer probe and come from the $i^{th}$ neighborhood, that is, the neighborhood where i die are known to be faulty. These i die have failed wafer probe testing. Since defects are known to cluster, one expects neighborhoods that contain many faulty die to be described by relatively large values of $\lambda = \lambda_K + \lambda_L$. Further, since $\lambda_L$ is proportional to $\lambda_K$, die originating from neighborhoods where $\lambda_K$ is relatively large will have a $\lambda_L$ value that is also large. These die will, on average, experience a larger number of infant mortality failures when compared to die from regions of lower $\lambda_K$.

Now, let $\lambda_i$ denote the average number of defects in the $i^{th}$ neighborhood. Then, based on the above discussion, one expects $\lambda_i > \lambda_j$ for i>j. Further, since die in the $i^{th}$ bin all come from the $i^{th}$ neighborhood, any latent defects present in this bin should be randomly distributed among the die. Thus, with $$\lambda_i = \lambda_{Ki} + \lambda_{Li} \qquad (17)$$

it follows that $$Y_{Li} = \exp(-\lambda_{Li}) \qquad (18)$$

for all i=0, 1, ..., 8. Equation (18) gives the reliability yield for die in the $i^{th}$ bin.

Note that while it is tempting to write $Y_{Li} = \exp(-\lambda_{Li}) = \exp(-\gamma \lambda_{Ki}) = Y_{Ki}^\gamma$, this is not correct. This is most easily seen by considering die in bin 0, where $\lambda_{K0}=0$, but $\lambda_{L0} \neq 0$. Thus, although die from bin 0 come from regions with no killer defects, they may still contain latent defects.

Probability theory is used to calculate the value of $\lambda_{Li}$ for each $i=0, 1, \ldots, 8$. These values are then used in equation (18) to estimate the reliability yield in the $i^{th}$ bin. As a starting point, it is assumed that defects are distributed over the 9-die neighborhood according to negative binomial statistics. Thus, the probability of exactly N defects is given by equation (8) with $\lambda$ replaced by $\lambda_9$, the average number of defects over the 9-die neighborhood. To incorporate neighborhood information let D(i) be the event that exactly i die in the 9-die neighborhood are faulty. Then P[K(m)L(n)|D(i)] is the probability that there are m killer and n latent defects per neighborhood, given that there are i faulty die in a 9-die neighborhood. It follows that the average number of latent defects per chip within the $i^{th}$ neighborhood, $\lambda_{Li}$, is given by $$\lambda_{Li} = \left(\frac{1}{9}\right) \sum_{m,n=0}^{\infty} nP[K(m)L(n) \mid D(i)] \quad (19)$$

Note that the factor $$\left(\frac{1}{9}\right)$$

is included to ensure that $\lambda_{Li}$ is the average number of latent defects per chip, not per neighborhood. Using Bayes' Law, P[K(m)L(n)|D(i)]P[D(i)]=P[D(i)|K(m)L(n)]P[K(m)L(n)], one may write $$\lambda_{Li} = \frac{\sum_{m,n=0}^{\infty} nP[D(i) \mid K(m)L(n)]P[K(m)L(n)]}{9P[D(i)]} \quad (20)$$

where $$P[D(i)] = \sum_{m,n=0}^{\infty} P[D(i) \mid K(m)L(n)]P[K(m)L(n)] \quad (21)$$

is used to calculate the denominator. The value of P[D(i)|K(m)L(n)] can be written as a recursion. That is, $$P[D(i) \mid K(m)L(n)] = \quad (22)$$
$$P[D(i) \mid K(m)L(n-1)]p_L + P[D(i) \mid K(m-1)L(n)]p_K\left(\frac{i}{9}\right) +$$
$$P[D(i-1) \mid K(m-1)L(n)]p_K\left(\frac{10-i}{9}\right)$$

with the restrictions P[D(0)|K(0)L(n)]=P[D(1)|K(1)L(n)]=1, P[D(0)|K(m)L(n)]=0 for m>0 and P[D(i)|K(m)L(n)]=0 for i>m. These restrictions hold for all values of n. The recursion may be derived by imagining all defects but one have been distributed. One then asks how the last defect may occur and enumerates the possibilities. Substitution of (22) into (20) completes the calculation of $\lambda_{Li}$. These values can be substituted into (18) to obtain the expected reliability yield for each bin.

Figure 5:
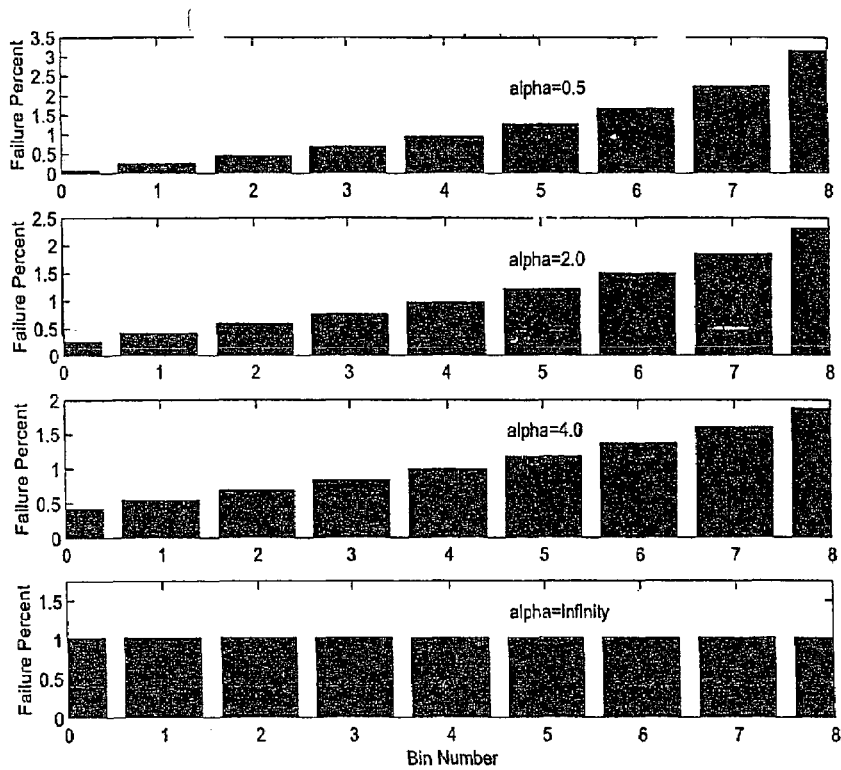
FIG. 5 shows the reliability failure probability for each of eight bins and for varying clustering parameter, determined according to an example embodiment of the present invention.

FIG. 5 shows the reliability failure probability $(1-Y_{Li})$ for die in each bin for various values of the clustering parameter $\alpha$, $Y_K=0.50$, and $\gamma=0.015$. Recall that a lower value of $\alpha$ indicates increased clustering, while $\alpha=\infty$ implies no clustering. Further, for $\gamma=0.015$, one expects, on average, 1.5 latent defects for every 100 killer defects.

As expected, FIG. 5 shows that the probability of failure increases as one moves from the lower numbered bins to the higher numbered bins. An exception to this is the case of $\alpha=\infty$, which corresponds to no clustering. In this case, the probability of failure is constant for each bin number. Thus, binning provides no advantage when defects follow a Poisson distribution.

Consider now the particular case of $\alpha=0.5$. Notice that the probability of failure in the best bin (i.e. bin number 0) is significantly lower than the other bins. In particular, die from bin 8 have a failure probability of 316 percent compared to 0.08 percent in bin 0. This means that a die selected from bin 8 is ~39 times more likely to fail burn-in than a die selected from bin 0. Further, compared to the average probability of failure of 0558 percent achieved without binning (see equation (15)), bin 0 represents a factor of ~7 improvement. Note, however, that these benefits decrease as the clustering parameter increases. Thus, for $\alpha=2$ and $\alpha=4$ the best bin shows a factor of 3.33 and 2.26 improvement over the no binning case, respectively.

Figure 6:
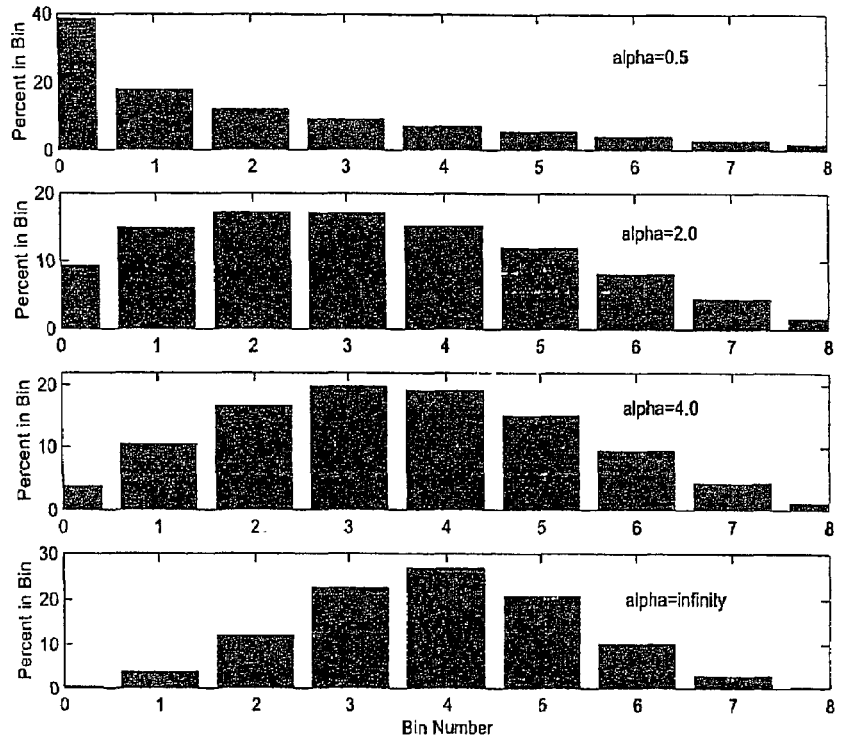
FIG. 6 shows the fraction of die in each of eight bins for varying clustering parameter values, according to an example embodiment of the present invention.

Although FIG. 5 indicates the potential of binning for improved reliability, it is important to realize that the usefulness of this technique depends significantly on the fraction of die in each bin. This is illustrated in FIG. 6 where the fraction of die in each bin is shown for $\alpha=0.5$, 2.0, 4.0 and $\infty$. With $\alpha=0.5$, most of the defects will be clustered together and there will be many neighborhoods with few, if any, defects. The result is a large number of die in the lower numbered bins. In particular, bin 0 contains ~40 percent of the die. When clustering decreases ($\alpha$ increases), however, the defects get distributed more evenly among the neighborhoods. For the more realistic value of $\alpha=2.0$, this results in fewer die in the best bin with the maximum number of die in bin 2. For $\alpha=4$ this effect is accentuated and the higher numbered bins become more heavily populated. Thus, as clustering decreases, fewer die are present in the lower numbered bins. Note that the bin variation for $\alpha=\infty$ is quite irrelevant since the probability of failure is the same in each bin when no clustering is present. Indeed, the bin variation for $\alpha=\infty$ is based solely on the wafer probe yield $Y_K$. This illustrates the important point that FIGS. 5 and 6 must be examined together to accurately evaluate the effectiveness of binning.

Figure 7:
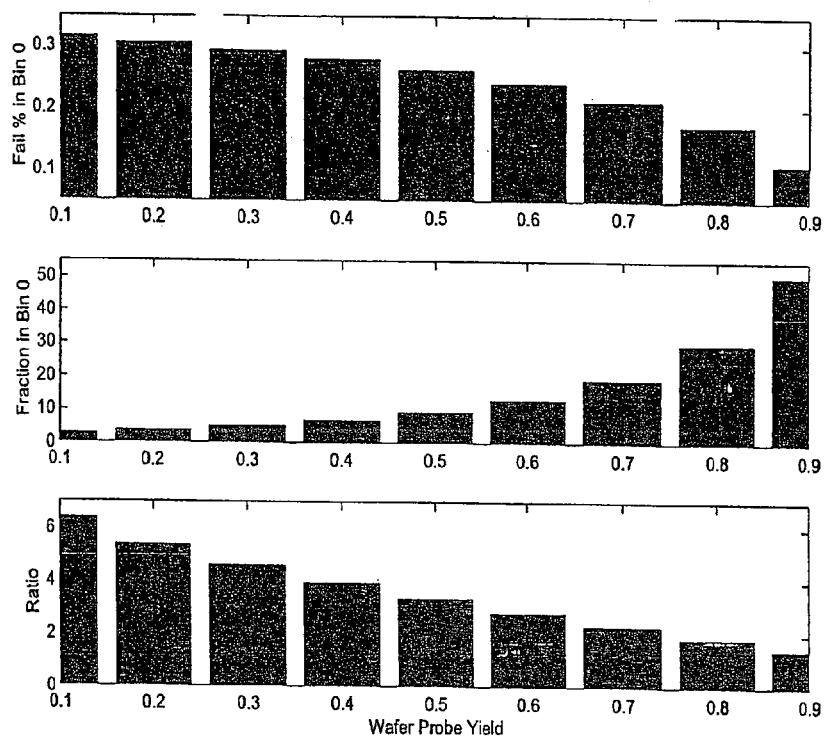
FIG. 7 shows the reliability failure probability in bin 0, fraction of die in bin 0, and the improvement ratio as a function of wafer probe yield, determined according to an example embodiment of the present invention.

Finally, it is important to consider how the above results depend on the wafer probe yield $Y_K$. For a fixed value of $\alpha$ and $\gamma$, low yields imply that, on average, a greater number of defects (both killer and latent) get distributed over each neighborhood. Thus, as the yield decreases, one expects a higher failure probability in each bin and a lower fraction of die in the lower numbered bins. These effects are illustrated in FIG. 7 for $\gamma=0.015$, $\alpha=2.0$, and $Y_K$ ranging from 0.10 to 0.90. Note that the bottom curve shows the probability of failure in the best bin divided by the average probability of failure obtained without binning. This ratio indicates the reliability improvement one sees in the best bin as compared to the lot taken as a whole. Note that while this ratio is maximum for low yields, the fraction of die present in the best bin under these circumstances is generally quite small.

Accordingly, it can be seen that the analytical model of the present invention accurately estimates the number of early-life reliability (burn-in) failures one can expect when employing the technique of binning. Predictions based on this model indicate that the fraction of die failing burn-in testing increases as one moves up in bin number. However, the number of die in each bin is shown to be dependent on the degree of clustering over a neighborhood; the greater the clustering, the greater the number of die in the lower numbered bins. Consequently, the advantage of binning, as well as the number of die available from the best bin, increases with increased clustering.

Another aspect of the invention utilizes an integrated yield reliability model to estimate the burn-in failure rate for chips containing redundant circuits that can be repaired to overcome manufacturing defects. These include, without limitation, repairable memory chips and other chips such as processors incorporating embedded repairable memories.

Memory die are used in a large number of MCMs, particularly in video and image processing applications. Modeling and understanding burn-in fall-out for such circuits is therefore of significant interest to the industry. Memory circuits require special considerations because they are generally repairable. Indeed, for over two decades now (since 64K D-RAMs), memory chip manufacturers have employed on-chip redundancy to replace faulty cells and repair defective memory circuits. While this can result in a significant increase in yield, it has been found that repaired memory chips are less reliable than chips without repairs. This is generally not due to any inherent weakness in the repair process, but results from the fact that defects tend to cluster on semiconductor wafers; a defect in a die increases the chance of a second defect nearby. While many of these defects can be repaired, some may be too "small" to be detected at initial testing, and can cause reliability (burn-in) failures.

Accordingly, it has been found that the integrated yield-reliability model described above can be extended to estimate the burn-in fall-out of repaired and unrepaired memory die, and therefore quantify the effect of repairs on the reliability of memory die. The model is based on the clustering of defects and the experimentally verified relation between catastrophic defects (detectable at wafer probe testing) and latent defects (causing burn-in or reliability failures). For example, the model can be used to calculate the probability that a die with a given number of repairs results in a burn-in failure. It will be shown that a die that has been repaired can present a far greater reliability risk than a die with no repairs. In applications with varying reliability requirements, this information can ensure proper selection of memory die. Applications requiring the highest reliability should, therefore preferably use memory die with no repairs.

The yield-reliability model described above can be applied to determine the reliability of a memory chip that has been repaired exactly m times. The clustering of defects suggests that a chip that has been repaired is more likely to contain latent defects than a chip with no repairs, and therefore, that repaired chips presents a greater reliability risk. The degree to which this statement is true can be quantified as follows.

Figure 8:
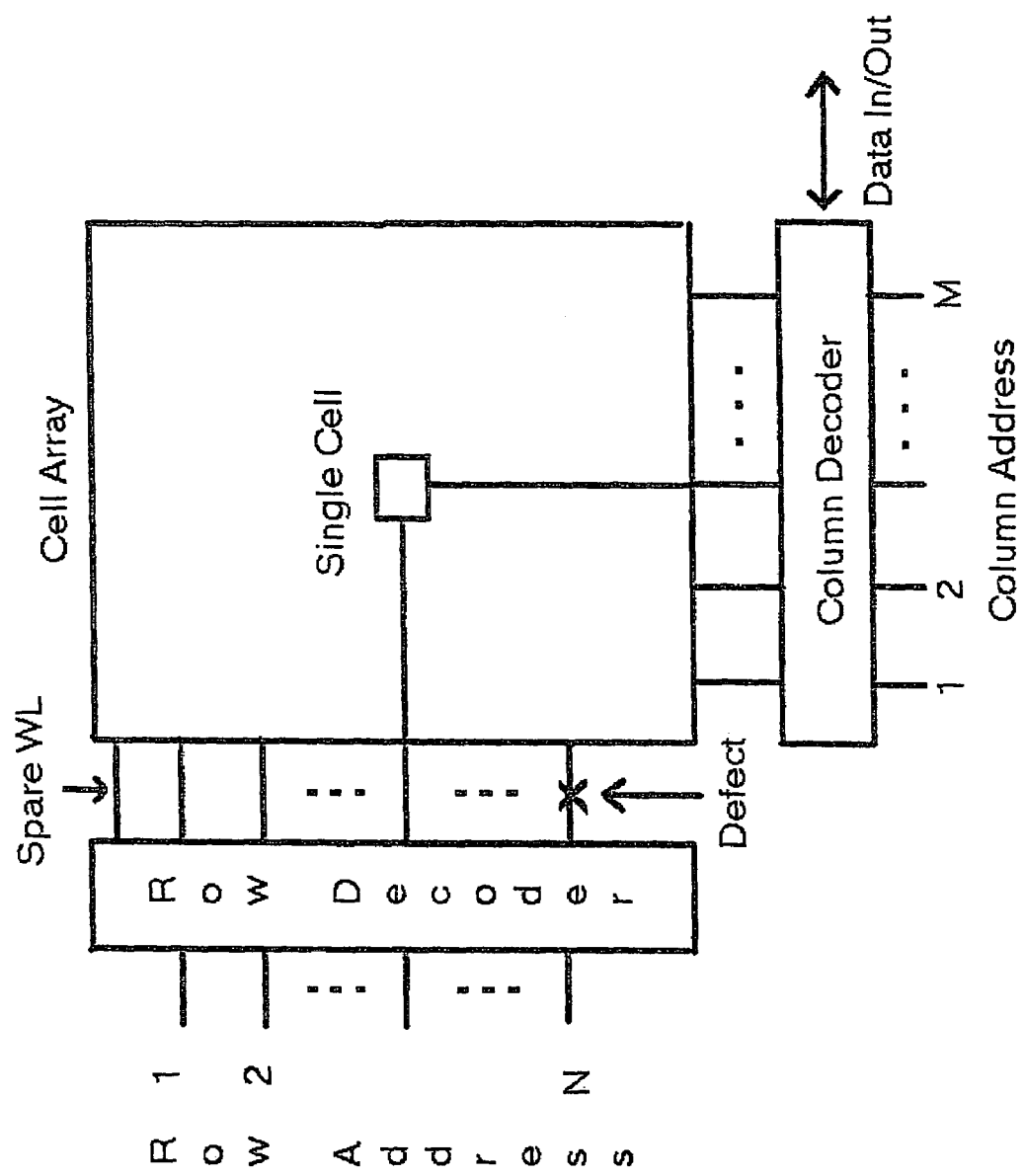
FIG. 8 shows a schematic of a typical component with redundant repairable memory cells.

A typical memory chip consists of a memory array(s) along with some control circuitry, (e.g. decoders, read/write enable lines), as shown in FIG. 8. Defect tolerance for such chips is generally limited to a fraction of the total chip area, leaving certain areas of the chip vulnerable to killer defects. For example, extra bit and word lines may be added to the memory array with no redundancy in the remaining sections of the circuit. This limits repairability to the memory array. Under such a scheme, killer defects affecting other areas of the chip typically can not be repaired and result in yield loss. While it is assumed here that a memory chip consists of repairable and non-repairable sections, the following analysis is quite general, and no reference is made to any particular redundancy scheme.

It is often convenient to consider killer defects separately from latent defects. Thus, to obtain the probability of exactly m killer defects, $P[K(m)]$, regardless of the number of latent defects, one can sum $P[K(m)L(n)]$ over n. The result is $$P[K(m)] = \frac{\Gamma(\alpha+m)}{m!\Gamma(\alpha)} \frac{\left(\frac{\lambda_K}{\alpha}\right)^m}{\left(1+\frac{\lambda_K}{\alpha}\right)^{\alpha+m}} \quad (23)$$

where $\lambda_K = p_K \lambda$. Thus, the number of killer defects follows a negative binomial distribution with parameters $(\lambda_K, \alpha)$. For m=0 equation (23) gives $$Y_K = P[K(0)] = \left(1+\frac{\lambda_K}{\alpha}\right)^{-\alpha} \quad (24)$$

$Y_K$ is often termed the perfect wafer probe yield to distinguish it from the yield achievable with repairable or redundant circuits. It is simply the probability of zero killer defects.

To incorporate repairability one must consider the probability that a killer defect can be repaired. If it is assumed that a given defect is just as likely to land anywhere within the chip area, then the probability that a killer defect lands within the non-repairable area, $A_{NR}$, is given by the ratio $p_{NR} = A_{NR}/A_T$, where $A_T$ is the total area of the chip. Similarly, the probability that a given defect is repairable is given by $p_R = A_R/A_T$, where $A_R$ is the repairable area of the chip. Note that $p_R + p_{NR} = 1$.

Now, let $G(i)$ be the event that a chip is functional and contains i killer defects. As the chip is functional, the i killer defects must have been repairable. Thus, $$P[G(i)] = p_R^i P[K(i)] \quad (25)$$

The effective wafer probe yield with repair, $Y_{Keff}$, is therefore $$Y_{Keff} = \sum_{i=0}^{\infty} P[G(i)] \quad (26)$$

$$= \left[1+\frac{\lambda_{Keff}}{\alpha}\right]^{-\alpha}$$

where $\lambda_{Keff} = (1-p_R)\lambda_K = p_{NR}\lambda_K$. Thus, repairability has the effect of reducing the average number of killer defects from $\lambda_K$ to $p_{NR}\lambda_K$. Note that extending the sum to infinity assumes that there is no limit to the number of repairs that can be made. This is justified by the fact that the probability of more than ~5 repairs is negligibly small for any reasonable wafer probe yield encountered in practice.

As a numerical example, suppose that 90 percent of the chip area is repairable. This implies that $p_{NR}=0.10$. If $\lambda_K=1$ and $\alpha=2$, then $Y_{Keff}=0.91$. With no repair capabilities, $p_{NR}=1$, and the yield is $Y_K=0.44$. Thus, repairability can have a very significant impact on wafer probe yield.

After defining the perfect wafer probe yield as $Y_K = P[K(0)]$, one may be tempted to define the reliability yield as the probability of zero latent defects, $Y_L = P[L(0)]$. This definition, however, is not correct. Indeed, while $P[L(0)]$ does give the probability of zero latent defects, it says nothing about the number of killer defects. Thus, a die containing zero latent defects may still contain one or more killer defects. Killer defect information must therefore be incorporated when defining reliability yield. This can be done by calculating the probability of n latent defects given m killer defects, denoted by P[L(n)|K(m)]. Using Bayes' Rule P[K(m)L(n)]=P[L(n)|K(m)] P[K(m)] along with equations (10) and (23) one can write $$P[L(n) | K(m)] = \frac{\Gamma(\alpha + m + n)}{n! \Gamma(\alpha + m)} \frac{\left(\frac{\lambda_L(0)}{\alpha}\right)^n}{\left(1 + \frac{\lambda_L(0)}{\alpha}\right)^{\alpha+m+n}} \quad (27)$$

where, $$\lambda_L(0) = \lambda_L \Big/ \left(1 + \frac{\lambda_K}{\alpha}\right)$$

is the average number of latent defects given that there are zero killer defects. Setting n=0 in equation (27) and defining $Y_L(m)=P[L(0)|G(m)]=P[L(0)|K(m)]$ gives $$Y_L(m) = \left(1 + \frac{\lambda_L(0)}{\alpha}\right)^{-(\alpha+m)} \quad (28)$$

This gives the reliability yield of a chip which has been repaired exactly m times.

Figure 9:
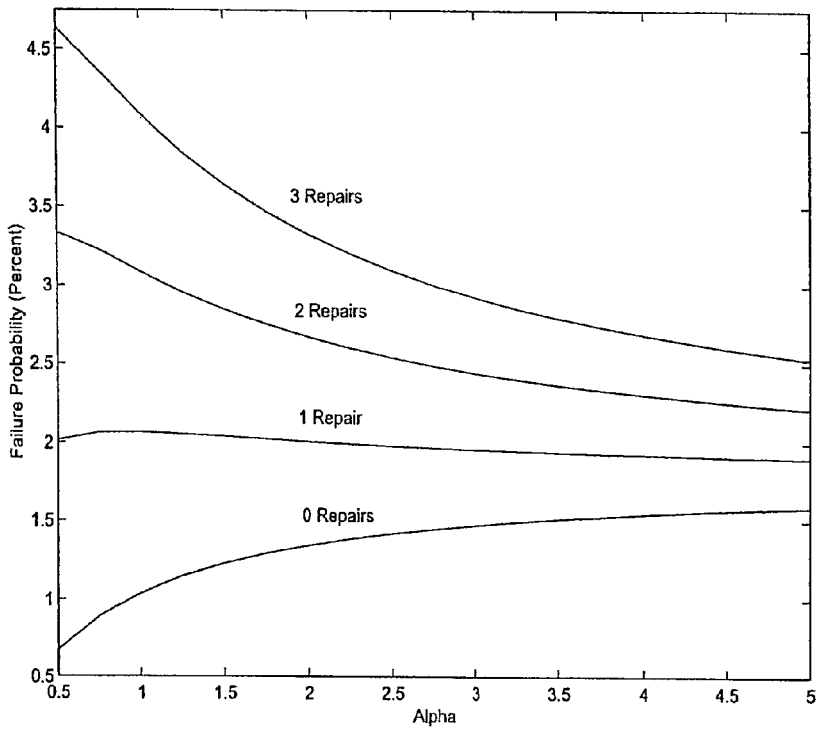
FIG. 9 shows the burn-in failure probability for memory components requiring 0, 1, 2 and 3 repairs, for various clustering parameter values, determined according to one example embodiment of the present invention.

FIG. 9 shows the burn-in failure probability $P_f(m)=1-Y_L(m)$ in percent as a function of the clustering parameter $\alpha$. Note that while $\alpha$ can certainly range from 0.5-5 in practice, a typical value may be between 1.5-2.0. The figure shows four curves corresponding to m=0, 1, 2 and 3 repairs. The perfect wafer probe yield was assumed to be $Y_K=0.30$, $\gamma=0.015$, and $p_{NR}=0.10$. Note also that this implies that the effective wafer probe yield, $Y_{Keff}$, varies from 0.71 when $\alpha=0.5$ to 0.88 when $\alpha=5$.

FIG. 9 shows that chips that have been repaired can have a probability of failure that is significantly greater than chips with no repairs. This is particularly apparent when there is a high degree of clustering (low value of $\alpha$). Indeed, for $\alpha=0.5$, the probability of failure is 0.68, 2.01, 3.33 and 4.63 percent for 0, 1, 2 and 3 repairs, respectively. This means that a chip with 1 repair is 2.01/0.68=2.96 times more likely to fail than a chip with no repairs. Furthermore, chips with 2 and 3 repairs are 4.90 and 6.81 times more likely to fail than a chip with no repairs. Note, however, that as $\alpha$ increases, the reliability improvement for chips with no repairs decreases. Thus, for $\alpha=2$, chips with 1 repair are 1.50 times more likely to fail, while chips with 2 and 3 repairs are 1.99 and 2.48 times more likely to fail than chips with no repairs. This trend continues as $\alpha$ increases. In particular, as $\alpha \to \infty$ (no clustering), the probability of failure becomes independent of the number of repairs. In such a case, repaired memory chips are just as reliable as memory chips with no repairs.

Figure 10:
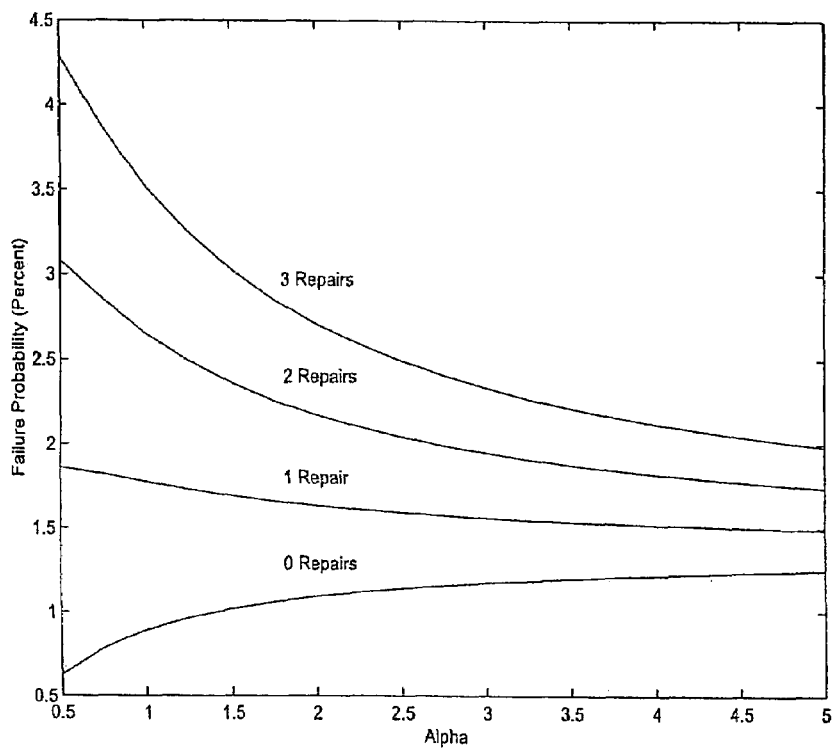
FIG. 10 shows the burn-in failure probability for memory components requiring 0, 1, 2 and 3 repairs, for various clustering parameter values, determined according to another example embodiment of the present invention.
Figure 11:
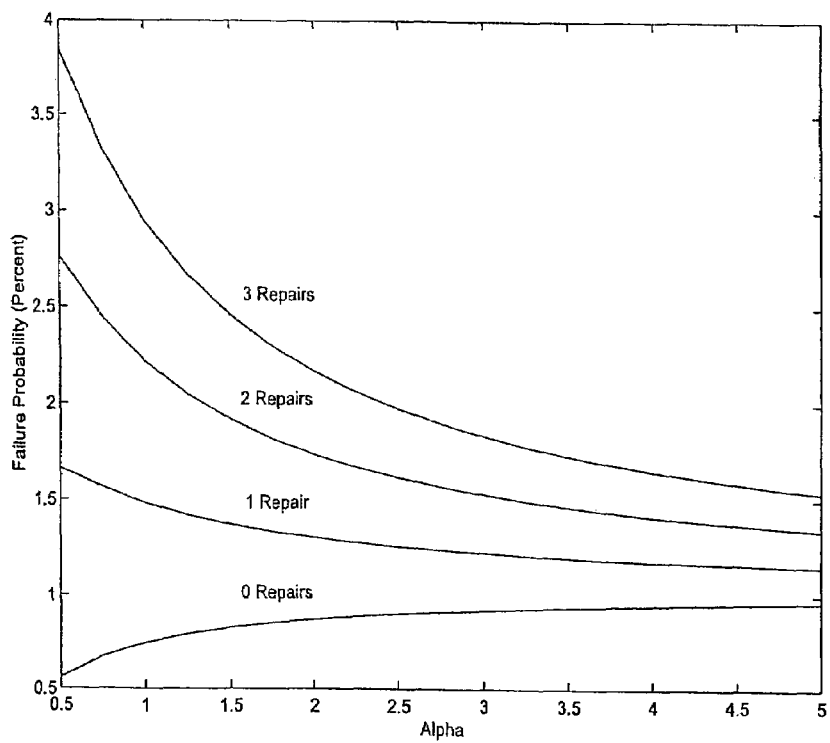
FIG. 11 shows the burn-in failure probability for memory components requiring 0, 1, 2 and 3 repairs, for various clustering parameter values, determined according to another example embodiment of the present invention.

FIGS. 10 and 11 show the burn-in failure probability as a function of $\alpha$ with 0, 1, 2 and 3 repairs for a perfect wafer probe yield of $Y_K=0.40$ and $Y_K=0.50$, respectively. Comparison of FIGS. 9, 10, and 11 indicates that the failure probability decreases as $Y_K$ increases. For example, suppose that $\alpha=2$ and a chip has been repaired twice. Then the failure probability is 2.67 percent for $Y_K=0.30$, 2.18 percent for $Y_K=0.40$, and 1.74 percent for $Y_K=0.50$. This decrease in failure probability with increasing $Y_K$ follows from the fact that, for a given clustering parameter $\alpha$, the average number of killer defects decreases as $Y_K$ increases. Since the average number of latent defects, $\lambda_L$, is proportional to $\lambda_K$, $\lambda_L$ also decreases as $Y_K$ goes up. The result is a decrease in the number of burn-in failures.

Let us now consider more closely how the burn-in failure probability depends on the number of repairs and the clustering parameter. This dependence is shown in FIG. 12, where the burn-in failure probability is plotted versus the number of repairs for various values of $\alpha$.

Notice that the curves are very linear with a slope that increases with decreasing $\alpha$. In particular, note that the slope goes to zero when $\alpha = \infty$. This corresponds to a Poisson distribution and implies no clustering.

Figures 12, 13:
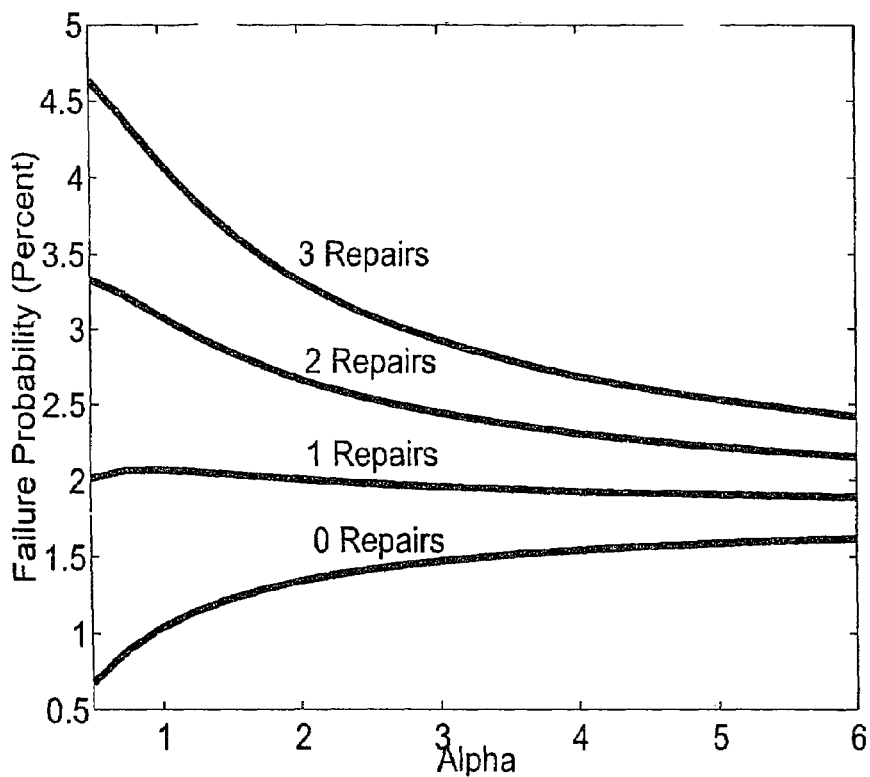
FIG. 12 shows the burn-in failure probability for memory components requiring 0, 1, 2 and 3 repairs, for various clustering parameter values, determined according to another example embodiment of the present invention.
FIG. 13 shows the relative failure probability for memory components requiring two repairs, for various clustering parameter values and perfect wafer probe yields, determined according to an example embodiment of the present invention.

To understand the linearity of the curves in FIG. 12 one needs to take a closer look at equation (28). In particular, when $\lambda_L(0)/\alpha \ll 1$ this equation can be written as $$Y_L(m) = \left(1 + \frac{\lambda_L(0)}{\alpha}\right)^{-(\alpha+m)} \quad (29)$$

$$\approx 1 - (\alpha + m)\frac{\lambda_L(0)}{\alpha}$$

The burn-in failure probability for a chip with m repairs, $P_f(m)$, is therefore $$P_f(m) = 1 - Y_L(m) \quad (30)$$

$$\approx (\alpha + m)\frac{\lambda_L(0)}{\alpha}$$

$$= \frac{\lambda_L(0)}{\alpha}m + \lambda_L(0)$$

This is the equation of a line with slope $\lambda_L(0)/\alpha$ and vertical intercept $\lambda_L(0)=P_f(0)$.

As a measure of the burn-in failure probability for chips with m repairs as compared to chips with no repairs, one may define the relative failure probability $R_f(m)=P_f(m)/P_f(0)$. Thus, from equation (30) it follows that $$R_f(m) = \frac{P_f(m)}{P_f(0)} \approx \frac{m}{\alpha} + 1 \quad (31)$$

Note that $R_f(m)$ provides a simple way to validate the proposed model. Indeed, according to equation (31), a plot of $R_f(m)$ versus m yields a straight line with slope $1/\alpha$ and a vertical intercept of 1. Further, since equation (31) depends only on the clustering parameter $\alpha$, one can estimate the relative failure probability for repaired memory chips once the clustering parameter $\alpha$ is known. This is generally known following wafer probe testing.

The accuracy of the approximations given in equations (29)-(31) are based on the assumption that $\lambda_L(0)/\alpha \ll 1$, where $$\lambda_L(0) = \gamma \lambda_K \Big/ \left(1 + \frac{\lambda_K}{\alpha}\right).$$

With $\lambda_K \sim 0.5$-3 and $\alpha \sim 1$-4 for reasonable wafer probe yields, the accuracy of the approximation depends primarily on the value of $\gamma$. For the recently reported values of $\gamma \sim 0.01$-0.02, this approximation is very good. For significantly larger values of γ, the accuracy decreases. FIG. 13 shows the exact value of $R_f(m=2)$ as compared to the approximation given in equation (31). Notice that the approximation agrees well with the exact value and is essentially independent of the perfect wafer probe yield $Y_K$.

As shown above, memory chips with no repairs can be significantly more reliable than chips with one or more repairs. The physical basis for this is rooted in defect clustering; latent defects are more likely to be found near killer defects. This concept can be extended to include neighboring die. That is, die whose neighbors have defects are more likely to contain latent defects than die whose neighbors are defect-free. Thus, to select die of the highest reliability, one must choose those die with 0 repairs whose neighbors are also free of killer defects, and therefore have not been repaired.

A detailed analysis of the reliability of non-redundant integrated circuits, separated based on nearest neighbor yield, is presented above. Application of this method to redundant circuits is carried out in a substantially similar manner. It is useful to consider the reliability improvement one might expect when selecting die with 0 repairs and 0 faulty neighbors. Intuitively, these die should be of very high reliability.

FIG. 14 compares the probability of failure of a memory die with 0 repairs to that of a memory die with 0 repairs and 0 faulty neighbors. The perfect wafer probe yield is $Y_K=0.40$ and γ=0.015. Notice that the die with 0 repairs and 0 faulty neighbors can have a failure probability that is significantly less than that of die with only 0 repairs. For example, for α=1.0 a die with 0 repairs has a failure probability of 0.892 percent, while a die with 0 repairs and 0 faulty neighbors has a failure probability of 0.155. Thus, a die with 0 repairs and 0 faulty neighbors is 0.892/0.155=5.75 times more reliable. A similar comparison can be made between repaired die and die with 0 repairs and 0 faulty neighbors. This is shown in FIG. 15. For α=1 and the same $Y_K$ and γ values given above, die with 0 repairs and 0 faulty neighbors are 2.79/0.155=18.0 times more reliable than die that have been repaired.

While the above numbers are very impressive, one must realize that the fraction of die with 0 repairs and 0 faulty neighbors is highly dependent on the clustering parameter α and the wafer probe yield $Y_K$. Thus, although these die exhibit a very low failure probability, the number of die with such high reliability may be quite small.

Thus, it can be seen that the analytical model presented herein accurately estimates the early-life reliability of repairable memory chips. Since defects tend to cluster, a chip that has been repaired has a higher probability of containing a latent defect than a functional chip with no repairs. Repaired chips therefore present a greater reliability risk than chips with no repairs. The burn-in failure probability was shown to depend primarily on the clustering parameter α; the greater the clustering (lower α), the greater the failure probability for repaired memory chips. Indeed, for the typical value of α=2, memory chips with 1-2 repairs were shown to produce 1.5-2.0 times as many burn-in failures as memory chips with no repairs. This result was shown to be largely independent of the perfect wafer probe yield $Y_K$. The common use of memory die in MCM and other applications makes reliability prediction for such die of great economic importance to industry. Such estimates provide the industry with a useful aid when deciding which die are appropriate for particular applications. In applications demanding the highest reliability, only those memory die with no repairs should be selected for use.

While the invention has been described with reference to preferred and example embodiments, it will be understood by those skilled in the art that a variety of modifications, additions and deletions are within the scope of the invention, as defined by the following claims.

What is claimed is:

1. A method of determining the reliability of a component, the method comprising:
    classifying the component based on an initial determination of a number of fatal defects; and
    estimating a probability of latent defects present in the component based on the classification, by integrating yield information based on the initial determination of a number of fatal defects using a statistical defect-clustering model.

2. The method of claim 1, wherein the step of classifying the component based on an initial determination of a number of fatal defects comprises determining a number of neighboring components having fatal defects.

3. The method of claim 1, wherein the step of estimating a probability of latent defects present in the component based on the classification comprises testing a sample of components from fewer than all of a plurality of classifications.

4. The method of claim 3, wherein the step of estimating a probability of latent defects present in the component based on the classification comprises testing a sample of components from one of a plurality of classifications.

5. The method of claim 4, wherein the one of a plurality of classifications from which a sample is tested is a classification corresponding to a maximum number of neighboring components having fatal defects.

6. The method of claim 2, wherein the number of neighboring components having fatal defects is determined from a neighborhood of immediately neighboring components.

7. The method of claim 6, wherein the neighborhood of immediately neighboring components comprises eight neighboring components surrounding a subject component.

8. The method of claim 1, wherein the step of classifying the component based on an initial determination of a number of fatal defects comprises determining a number of repairs carried out on a repairable electronic component.

9. The method of claim 8, wherein the step of estimating a probability of latent defects present in the component based on the classification comprises testing a sample of components from fewer than all of a plurality of classifications.

10. The method of claim 9, wherein the step of estimating a probability of latent defects present in the component based on the classification comprises testing a sample of components from one of a plurality of classifications.

11. The method of claim 10, wherein the one of a plurality of classifications from which a sample is tested is a classification corresponding to a maximum number of repairs carried out on the component.

12. The method of claim 8, wherein the step of classifying the component based on an initial determination of a number of fatal defects further comprises determining a number of repairs carried out on a neighboring component.

13. The method of claim 1, wherein the step of estimating a probability of latent defects present in the component based on the classification comprises determining a ratio of fatal defects to latent defects.

14. The method of claim 1, further comprising optimizing subsequent testing of the component based on an estimated reliability of the component.

15. The method of claim 1, further comprising testing the component if an estimated a probability of latent defects present in the component exceeds a specified rate.

16. The method of claim 1, wherein the step of classifying the component comprises separating a plurality of components into a plurality classifications.

17. The method of claim 16, further comprising statistically predicting the reliability of components in each of the plurality of classifications by testing a sample of components from fewer than all of the plurality of classifications.

18. The method of claim 1, wherein the component is a die for assembly into a multi-chip module, and wherein the method further comprises rejecting die determined to have a reliability below a specified rate.

* * * * *

(12) INTER PARTES REEXAMINATION CERTIFICATE (1184th)

United States Patent
Singh et al.

(10) Number: US 7,409,306 C1
(45) Certificate Issued: Oct. 2, 2015

(54) SYSTEM AND METHOD FOR ESTIMATING RELIABILITY OF COMPONENTS FOR TESTING AND QUALITY OPTIMIZATION

(75) Inventors: Adit D. Singh, Auburn, AL (US); Thomas S. Barnett, South Burlington, VT (US)

(73) Assignee: AUBURN UNIVERSITY, Auburn University, AL (US)

Reexamination Request:
No. 95/001,575, Mar. 16, 2011

Reexamination Certificate for:
Patent No.: 7,409,306
Issued: Aug. 5, 2008
Appl. No.: 11/715,172
Filed: Mar. 6, 2007

Related U.S. Application Data

(62) Division of application No. 10/274,439, filed on Oct. 18, 2002, now Pat. No. 7,194,366.

(60) Provisional application No. 60/347,974, filed on Oct. 19, 2001, provisional application No. 60/335,108, filed on Oct. 23, 2001, provisional application No. 60/366,109, filed on Mar. 20, 2002.

(51) Int. Cl.
*G06F 19/00* (2011.01)
*H01L 21/66* (2006.01)
*G01R 31/28* (2006.01)

(52) U.S. Cl.
CPC ............ *H01L 22/20* (2013.01); *G01R 31/287* (2013.01)

(58) Field of Classification Search
None
See application file for complete search history.

(56) References Cited

To view the complete listing of prior art documents cited during the proceeding for Reexamination Control Number 95/001,575, please refer to the USPTO's public Patent Application Information Retrieval (PAIR) system under the Display References tab.

*Primary Examiner* — Anjan Deb

(57) ABSTRACT

A system and method for determining the early life reliability of an electronic component, including classifying the electronic component based on an initial determination of a number of fatal defects, and estimating a probability of latent defects present in the electronic component based on that classification with the aim of optimizing test costs and product quality.

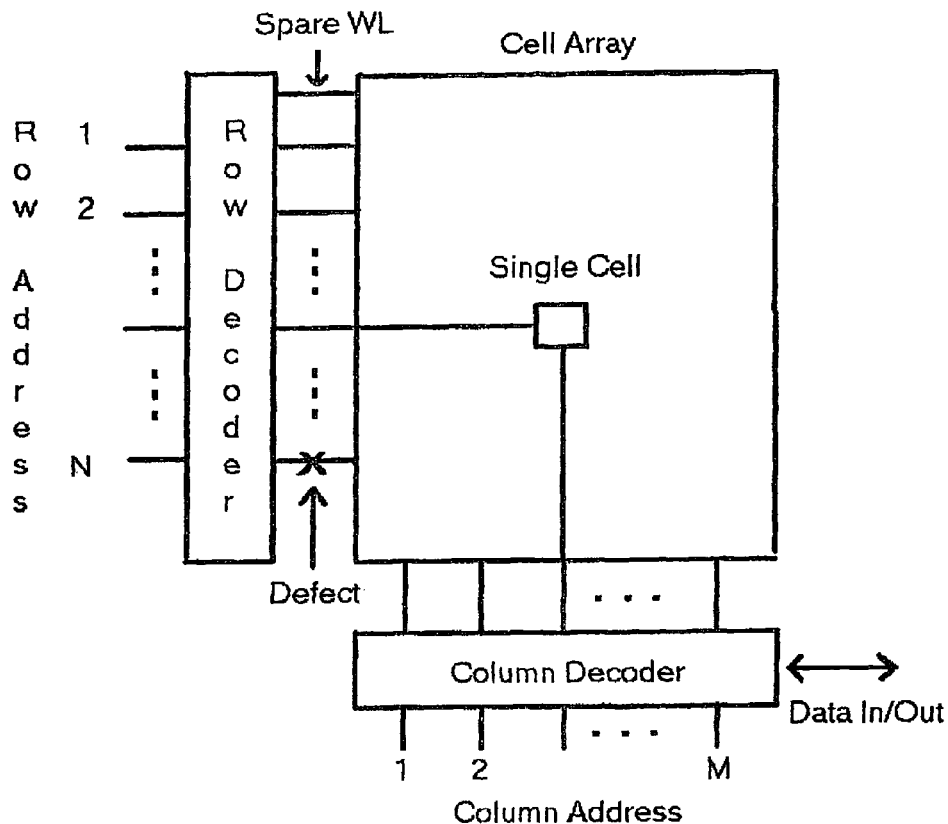

INTER PARTES REEXAMINATION CERTIFICATE

THE PATENT IS HEREBY AMENDED AS INDICATED BELOW.

AS A RESULT OF REEXAMINATION, IT HAS BEEN DETERMINED THAT:

Claims 1-18 are cancelled.

\* \* \* \* \*